United States Patent [19]

DeCook

[11] Patent Number: 5,300,183
[45] Date of Patent: Apr. 5, 1994

[54] FLEXURE PLATE FOR A LAMINATOR APPARATUS

[75] Inventor: Bradley C. DeCook, Rochester, N.Y.

[73] Assignee: Eastman Kodak Company, Rochester, N.Y.

[21] Appl. No.: 749,065

[22] Filed: Aug. 23, 1991

[51] Int. Cl.⁵ .................. B32B 31/04; B65H 29/00
[52] U.S. Cl. ........................... 156/555; 156/556; 271/275; 271/277
[58] Field of Search ............... 156/555, 556, 557, 559, 156/563, 566, 567, 568; 271/275, 277

[56] References Cited

U.S. PATENT DOCUMENTS

| 3,582,437 | 6/1971 | Lenk | 156/567 X |
|---|---|---|---|
| 3,825,462 | 7/1974 | Ettel | 156/582 |
| 3,884,461 | 5/1975 | Hauser | 271/277 |
| 3,971,691 | 7/1976 | Cairns | 156/497 |
| 4,060,441 | 11/1977 | Ohta et al. | 156/234 |
| 4,072,306 | 2/1978 | Idstein | 271/277 X |
| 4,259,695 | 3/1981 | Nakano | 271/277 X |
| 4,280,693 | 7/1981 | Matsuhisa et al. | 271/277 X |
| 4,310,365 | 1/1982 | Elliott et al. | 156/55 |
| 4,353,776 | 10/1982 | Giulle et al. | 156/555 |
| 4,595,931 | 6/1986 | Toganoh et al. | 346/1.1 |
| 5,024,714 | 6/1991 | Lemelson | 156/243 |

Primary Examiner—David A. Simmons
Assistant Examiner—J. Sells
Attorney, Agent, or Firm—J. Gary Mohr

[57] ABSTRACT

A laminating apparatus for laminating a material such as paper stock. Once the paper stock is laminated an image is transferred to the laminated paper stock. A flexure plate is provided to maintain the paper stock or the laminated paper stock free of creases or wrinkles. The image transferred to the laminated paper stock appears as if the image had been printed on said paper stock.

8 Claims, 9 Drawing Sheets

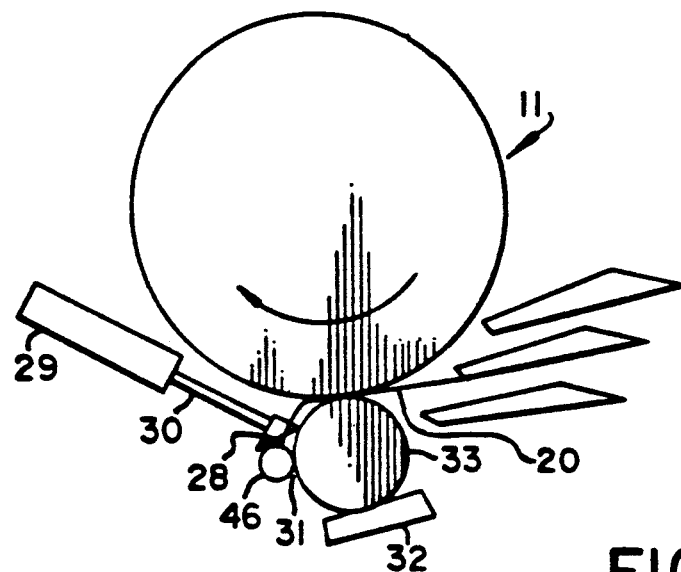
FIG. 3
FIG. 4
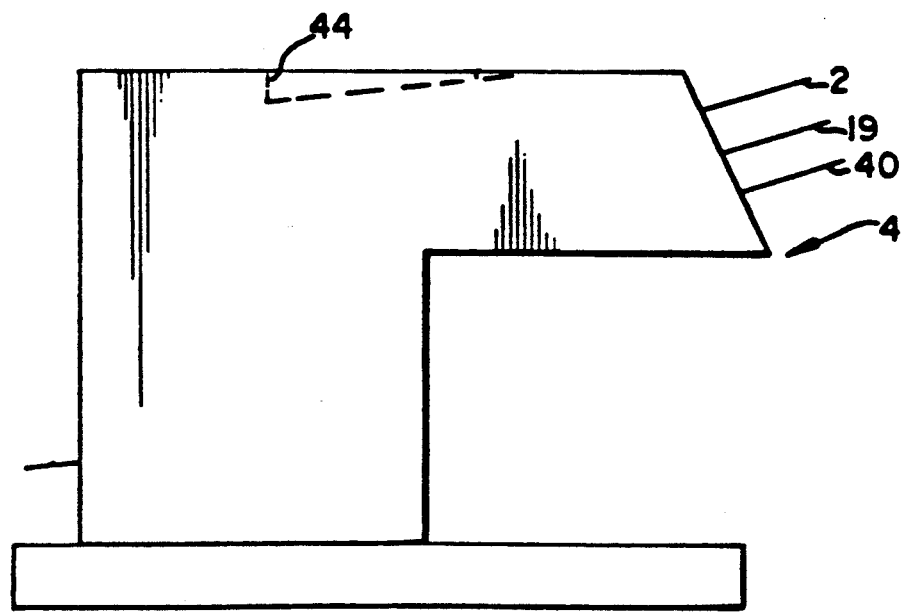

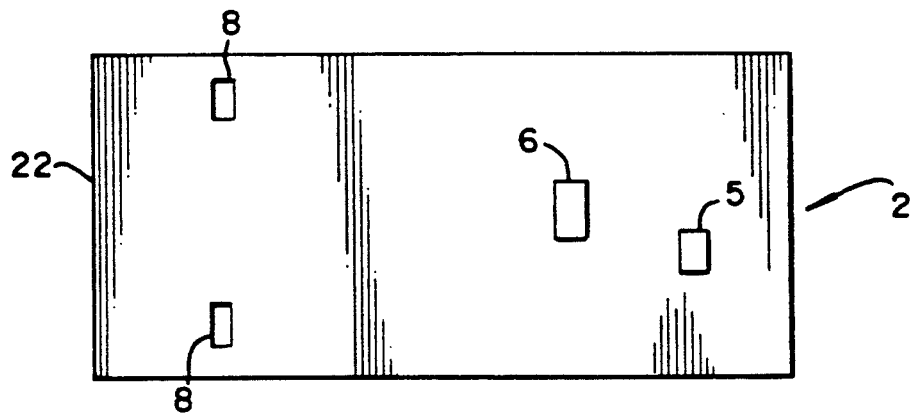
FIG. 5
FIG. 6
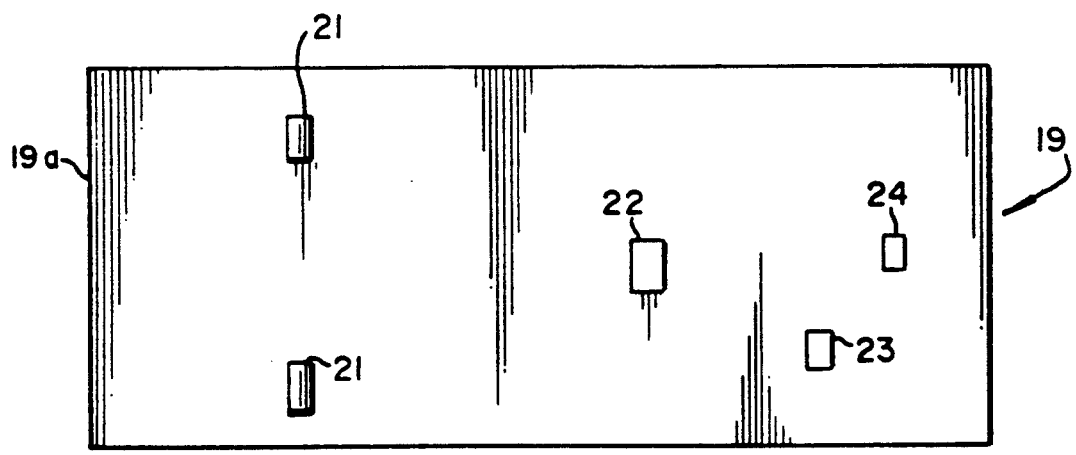

FIG. 15
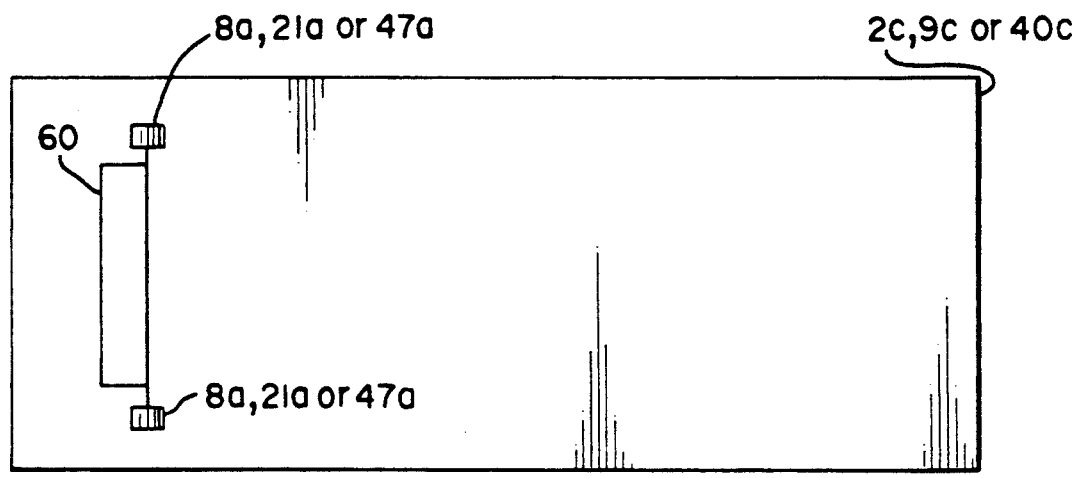
FIG. 17
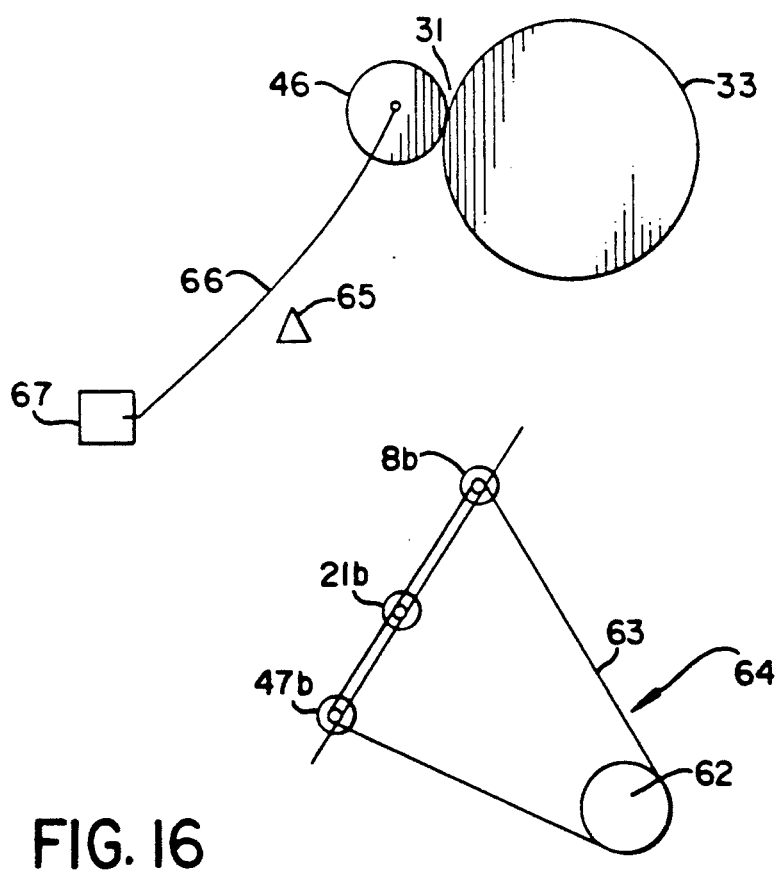
FIG. 16

, 1

FLEXURE PLATE FOR A LAMINATOR APPARATUS

BACKGROUND OF THE INVENTION

Proofing is the procedure used by the printing industry for creating representative images that replicate the appearance of printed images without the cost and time required to actually set up a high-speed, high-volume printing press to print an example of the images intended. Ideally, these representative images, or proofs, are generated, if in color, from the same color-separations used to produce the individual color printing plates used in printing presses so that variations in the resulting images can be minimized. Various proofing systems have been devised to create the proofs and have included the use of smaller, slower presses as well as means other than presses, such as photographic, electrophotographic, light imaging and nonphotographic processes.

The proofs generated are judged for composition, screening, resolution, color, editing and other visual content. The closer the proof replicates the final image produced on the printing press, as well as the consistency from image to image, from press to press and shop to shop, the better the acceptance of the proofing system by the printing industry. Other considerations used in judging proofing systems include reproducability, cost of the system as well as cost of the individual proofs, speed and freedom from environmental problems.

It is generally necessary to produce a "hard copy" (i.e. an image actually formed on a sheet of paper or other proof receiving material) before it can be fully assessed for final printing approval. Thus, each of the proofing systems require the use of some form of output device or printer which can produce a hard copy, on the type of media to be used in the printing process, so that the image can be properly evaluated. It is to the field of proofing output devices that the present invention is directed.

While purely photographic processes can provide accurate reproductions of images, they do not always replicate the reproduction resulting from printing presses nor is the media on which the image is to be printed necessarily the same media as used in the photographic process. Since the appearance of the final printed image is affected by the characteristics of the media upon which it is to be printed, the chemical make-up of the substance used to produce the image or other materials used to produce the hard copy are critical. Thus the ability to form the proof image on the material actually used in the printing process is a determining factor in the selection of the proofing system.

One form of image representation is produced on a plastic receiver film in which the plastic receiver is passed through a color copier and while said plastic receiver is supported on a rotatable copy drum, dye is transferred by sublimation to the plastic receiver to form a full color image on said receiver.

The problem is to prevent creases and wrinkles in the paper or media.

SUMMARY OF THE INVENTION

A conforming means comprising a rotary drum, an entrance slot means, within the rotary drum, for guiding a leading edge of the material to a rotary feeding means, the rotary feeding means includes means for feeding the leading edge of the material into the rotary feeding means and locking the leading edge of the material in the rotary feeding means, the entrance slot means is curved where the leading edge of the material enters the entrance slot means to prevent creasing and wrinkling of the material, a flexure means for making contact and urging the material against the rotary drum as it passes the flexure means.

An object of the present invention is to provide a high quality lamination system that is virtually free of wrinkles and creases.

BRIEF DESCRIPTION OF THE DRAWINGS

FIG. 3 is a side schematic view of the laminator in accordance with the invention with the bladder inflated and parts removed for clarity.

FIG. 4 is a side view of the laminator housing in accordance with the invention.

FIG. 5 is a top schematic view of the paper stock feed tray in accordance with the invention.

FIG. 6 is a top schematic view of the prelaminate feed tray in accordance with the invention.

FIG. 15 is a top schematic view of the cover for the feed trays in accordance with the invention.

FIG. 16 is a side schematic view of the roller drive system in accordance with the invention.

FIG. 17 is a side schematic view of the delamination roller system in accordance with the invention.

DESCRIPTION OF THE PREFERRED EMBODIMENT

In describing the preferred embodiment of the invention, reference is made to the drawings, wherein like numerals indicate like parts and structural features in the various views, diagrams and drawings. For the sake of discussion, but not limitation, the preferred embodiment of the present invention will be described in relation to a laminating apparatus for making image proofs on a paper stock, since the usual proofing practice is to make a hard copy of the image proof on paper stock. The present invention, however, is not limited to making hard copies of proof images on paper stock, since it can produce hard copies of proof images on a wide variety of media that may be used in the printing process.

Figure 1:
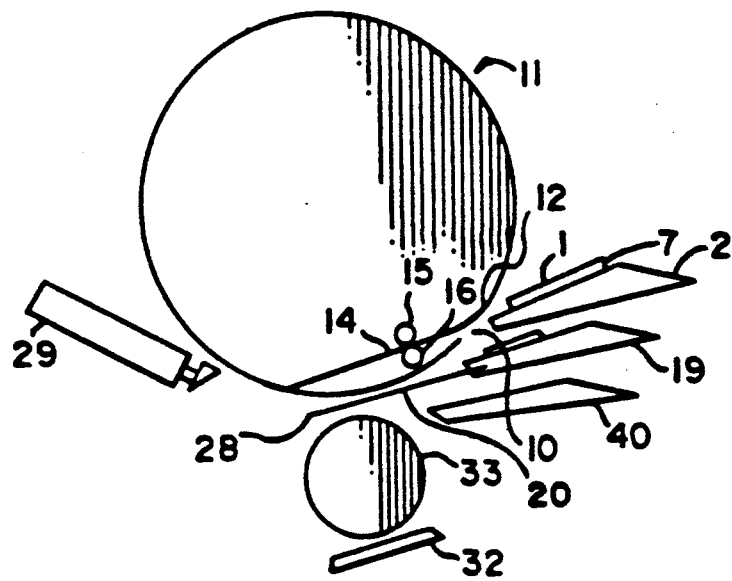
FIG. 1 is a side schematic view of the laminator in accordance with the invention prior to the start of lamination with parts removed for clarity.

In FIG. 1 paper stock 1 is placed on paper feed tray 2 for feeding to a laminator 4, shown in FIG. 4. Integral with paper feed tray 2 are two sensors, as shown in FIG. 5. The first sensor 5, senses the presence or absence of paper stock 1 in paper feed tray 2 and the second sensor 6, senses the trailing edge 7 of paper stock 1 as it travels over sensor 6 on its feed travel toward drum 11 of laminator 4. Prior, however, to feeding paper stock 1 into laminator 4, and subsequent to the operator pushing a start button, not shown, on laminator 4, drum 11, of laminator 4 is caused to rotate, by a signal from encoder 51, shown in FIG. 9, to a drum drive motor, not shown, to the drum 11 start position, as shown in FIG. 1. This places drum 11 in position to receive paper stock 1 from feed tray 2.

Figure 7:
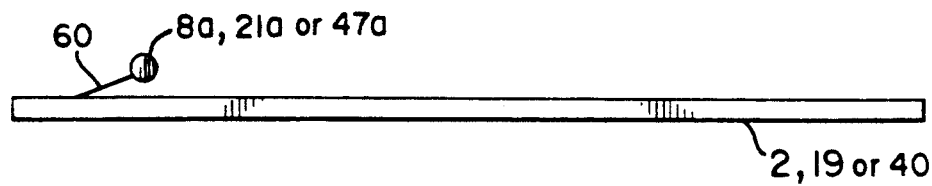
FIG. 7 is a side schematic view of the cover for the feed trays in accordance with the invention.
Figure 8:
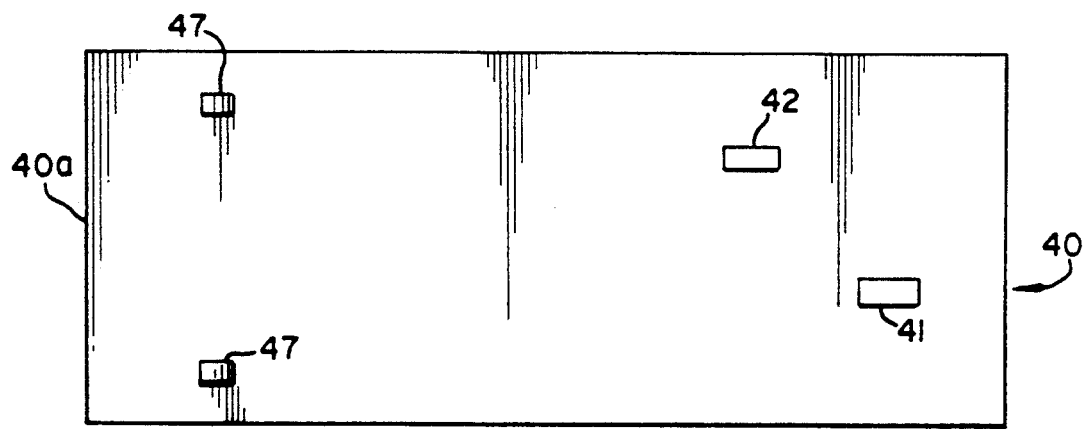
FIG. 8 is a top schematic view of the receiver feed tray in accordance with the invention.

The drive, for feeding paper stock 1, prelaminate 20 and receiver 34 to laminator 4, is provided by a roller drive system 64, as shown in FIG. 16. Roller drive system 64 is activated each time paper stock 1, prelaminate 20 or receiver 34 is to be fed into laminator 4. As shown in FIG. 16, once drive system 64 is actuated, drive rollers 8b, 21b and 47b are all driven by the same drive motor 62, through drive linkage 63. This causes rollers 8b, 21b and 47b to rotate through slots 8, 21 and 47 of feed trays 2, 19 and 40 in slipping contact with paper stock 1, prelaminate 20 and receiver 34 loaded in those trays. Because there is only slipping rotational contact and retaining gates 2a, 19a and 40a are in a blocking or closed position, as shown in FIGS. 5, 6 and 8, paper stock 1, prelaminate 20 and receiver 34 remain fixed in their respective feed trays. However, upon encoder 51 sending a signal, to a solenoid, not shown, but known in the art, that drum 11 is in the paper stock receiving position, it causes the actuation of that solenoid to cause pinch plate 60, as shown in FIGS. 7 and 15, of paper feed tray cover 2c, to move rollers 8a into contact with paper stock 1 loaded in paper stock feed tray 2. The pinching of paper stock 1 between rollers 8a and 8b causes paper stock 1 to move toward drum 11 because of the rotation of rollers 8b. Immediately upon the movement of paper stock 1 toward drum 11, cause by the pinching action of rollers 8a and 8b, retaining gate 2a is opened. This rotational feeding force of rollers 8b, coupled with the incline of paper feed tray 2 toward laminator 4, urges paper stock 1 into laminator 4 and toward drum 11.

Figure 9:
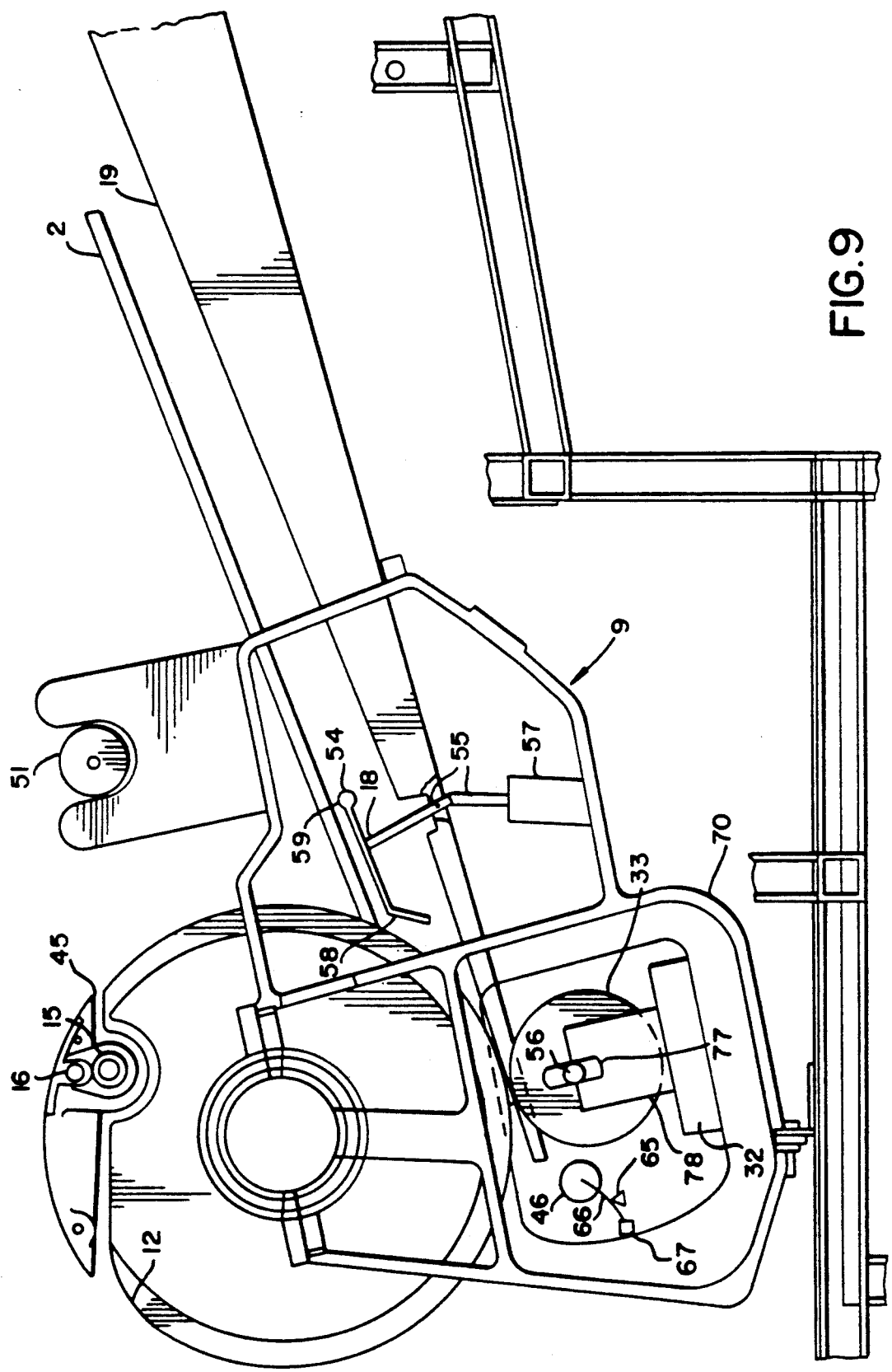
FIG. 9 is a side view of the housing for the drum and fuser in accordance with the invention.
Figure 14:
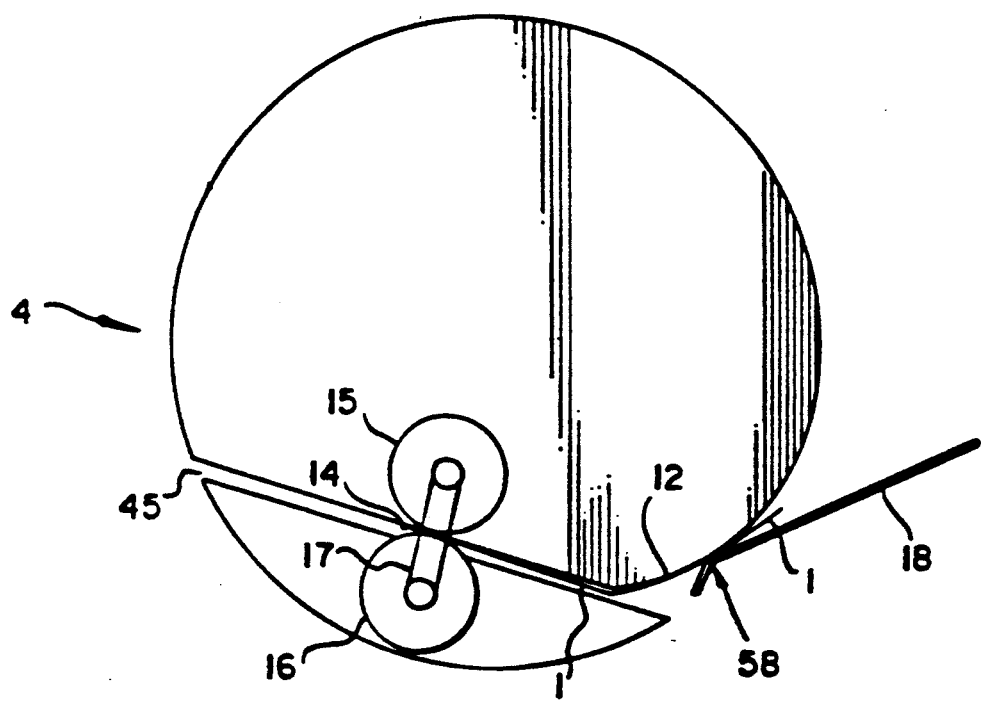
FIG. 14 is a side schematic view of the drum with the flexure plate in accordance with the invention.

Paper stock 1 enters drum 11 through slot 10 of drum 11, as shown in FIGS. 9 and 14. Slot 10, as shown in FIG. 14, has a curvature 12 near the outer circumference of drum 11, to prevent paper stock 1, as it bends around curvature 12, while entering slot 10, from being creased during its entry or while being held within slot 10, as later to be described. Paper stock 1 continues to travel into slot 10 until its leading edge 13, is secured in nip 14, formed by rollers 15 and 16 as shown in FIG. 14.

Roller 15 is constructed of compliant material such as silicone, whereas roller 16 is constructed of a material such as nickel plated steel. About rollers 15 and 16 is spring 17, causing rollers 15 and 16 to be biased toward each other as shown in FIG. 9. Due to the compliant construction of roller 15 and the spring bias provided by spring 17, nip 14, formed by said rollers, can accommodate a wide variety of the commercially known paper stocks, such as 30 pound paper to 0.024 inch paper, without manual adjustment of the parameters of nip 14. The parameters of nip 14 are, however, adjustable for special handling purposes.

While rollers 15 and 16, as well as feed rollers 8b, are to begin their rotation when the operator pushes the start button of laminator 4 for lamination of paper stock 1, rollers 15, 16 and 8b, will not operate unless at least paper tray 2 and prelaminate tray 19 are loaded as sensed by sensors 5 and 22 of trays 2 and 19. Once these rollers, however, are started in rotation, their rotation continues until the trailing edge 7 of paper stock 1 moves across sensor 6. At that point in time the leading edge 13 of paper stock 1 is within nip 14. Rollers 15 and 16, as well as feed rollers 8b, are then deactivated, by signal from sensor 6 and their rotation stopped. Sensor 6 also sends a signal so that retainer gate 2a is moved to its closed position and pinch plate 60, of paper feed tray 2, returns pinch rollers 8a to their original positions. With the simultaneous stopping of rotation of rollers 15 and 16 and feed rollers 8b, overdrive of paper stock 1, by rollers 8b, into nip 14 is prevented along with the problem of wrinkling or creasing of paper stock 1 due to overdrive.

With the stopping of rollers 15 and 16, the leading edge 13 of paper stock 1 is securely locked in nip 14. This locking is caused by the frictional contact of paper stock 1 with the stopped surfaces of rollers 15 and 16, the deactivation of driver motor, not shown, for rollers 15 and the fact that roller 15 is controlled by a one way clutch, not shown, but known in the art, that prevents roller 15 from rotating in such a manner that would allow paper stock 1 to back out of nip 14. The force needed to overcome this locking of paper stock 1, in nip 14, is greater than the force exerted by drum 11, on paper stock 1, as drum 11 rotates with paper stock 1. Therefore paper stock 1 is retained, in nip 14, until rollers 15 and 16 are reactivated to cause paper stock 1 to be driven through nip 14 on its way to exit 44 of laminator 4.

With the rotational stopping of rollers 15, 16 and feed rollers 8b, drum 11 is again activated by a signal from encoder 51, causing clockwise rotation of drum 11 and a pulling of paper stock 1 into laminator 4. As paper stock 1 is pulled into laminator 4, it is urged against the outer surface 19 of drum 11, by flexure plate 18. Flexure plate 18, when activated by encoder 51, is positioned adjacent drum 11 of laminator 4 and in contact with paper stock 1 or laminated paper stock 1a, as shown in FIG. 14.

Figure 10:
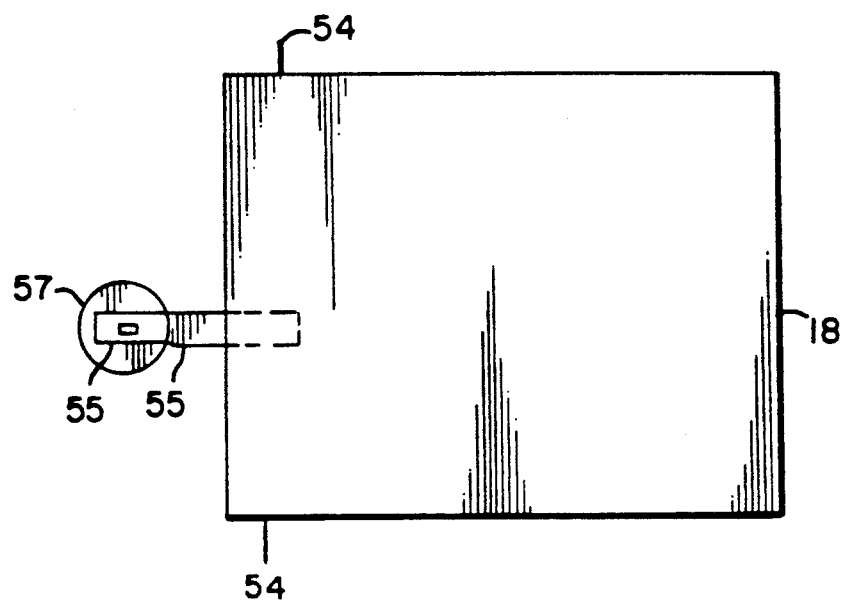
FIG. 10 is a top schematic view of the flexure plate in accordance with the invention.
Figure 11:
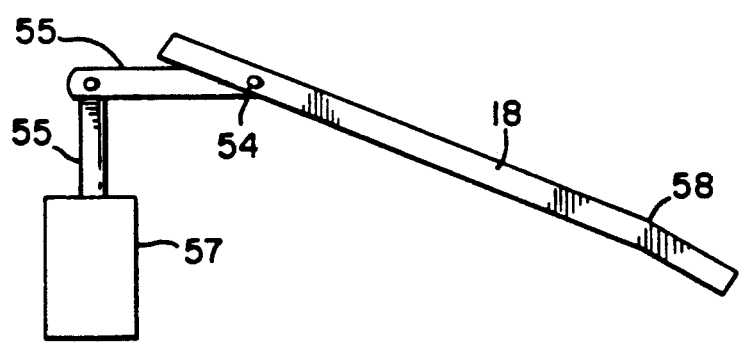
FIG. 11 is a side schematic view of the flexure plate in accordance with the invention.

As shown in FIGS. 10 and 11, flexure plate 18 is secured to rotational shaft 54 with each end of shaft 54 being mounted in bearing 59 of laminator housing 9, as shown in FIG. 9. Rotational shaft 54 has attached to it adjustment arms 55, which are activated by a signal from encoder 51 to solenoid 57 as encoder 51 tracks the rotation of drum 11 to the position where slot 10 of drum 11 is passing over contact point 58 of flexure plate 18. Upon activation, solenoid 57 causes rotational shaft 54 of flexure plate 18, through adjustment arms 55, to rotate in bearings 59 so that contact point 58 of flexure plate 18 makes contact with paper stock 1. Since only contact point 58 makes contact with the paper stock 1 or laminated paper stock 1a, unnecessary deformation or scratching of paper stock 1 or laminated paper stock 1a is avoided. The contact of contact point 58 with paper stock 1 or laminated paper stock 1a, coupled with the securing of leading edge 13 of paper stock 1 or laminated paper stock 1a in nip 14 causes paper stock 1 or laminated paper stock 1a to conform to drum 11 as it rotates. This assures that creases and wrinkles will not form during the laminating of paper stock 1 or the image transfer to laminated paper stock 1a.

Flexure plate 18 remains in its activated position, adjacent drum 11, causing paper stock 1 or laminated paper stock 1a to continually conform to drum 11, until the trailing edge 7 of paper stock 1 or the trailing edge 7a of laminated paper stock 1a passes over contact point 58 of flexure plate 18. At this time, encoder 51 signals solenoid 57 to deactivate. Deactivation of solenoid 57 causes adjustment arms 55 to rotate shaft 54, within bearings 59, so that flexure plate 18 returns to its original position, as shown in FIG. 9. The process of flexure plate 18 making contact with paper stock 1 occurs whenever slot 10 containing paper stock 1 passes over contact point 58 of flexure plate 18 or whenever slot 10 containing laminated paper stock 1a passes over contact point 58 of flexure plate 18. By keeping paper stock 1 or laminated paper stock 1a in conformity with drum 11, creases and wrinkles of paper stock 1 or laminated paper stock 1a are avoided during the laminating or image transfer process, both of which processes will be explained later. Since flexure plate 18 is resilient, it is able to conform to a wide variety of paper stock or other media stock without the need of manual adjustment.

When drum 11, with paper stock 1 conforming to its outer surface 19, rotates clockwise to where entrance slot 10 is adjacent to prelaminate tray 19, as tracked by encoder 51, drum 11 again ceases its rotation. At this point prelaminate 20, which may be a laminate of butvar such as polyvinylbutyal and an ester such as poylethyleneterephyhalate, however, other laminates may be used, is fed from prelaminate tray 19 toward drum 11. This feeding is accomplished by again activating drive roller system 64, as previously discussed. However, encoder 51 now signals the actuation of a solenoid, not shown, but known in the art, that causes pinch plate 60, of prelaminate feed tray cover 19c, to move rollers 21a into contact with prelaminate 20, loaded in prelaminate feed tray 19. The pinching of prelaminate 20 between rollers 21a and 21b causes prelaminate 20 to move toward drum 11 due to the rotation of rollers 21b. Immediately upon the movement of prelaminate 20, caused by the pinching action of rollers 21a and 21b, retaining gate 19a is caused to open. The rotational feeding force of rollers 21b, coupled with the incline of prelaminate feed tray 19 toward laminator 4, urges prelaminate 20 into laminator 4 and toward drum 11.

As shown in FIG. 6, prelaminate feed tray 19 has three sensor switches 22, 23 and 24 integral with prelaminate feed tray 19. Sensor 22 detects the presence or absence of a prelaminate 20 in prelaminate tray 19, sensor 23 detects the trailing edge 25 of prelaminate 20 during the automatic delamination process and sensor 24 detects the trailing edge 25 of prelaminate 20 during the manual delamination process. Therefore in the automatic delamination process upon activation of sensor 23 by the trailing edge 25 of prelaminate 20 passing over it, sensor 23 stops the rotation of prelaminate feed rollers 21b to stop the feeding of prelaminate 20 toward drum 11 and closes retaining gate 19a. This prevents overdrive which could wrinkle paper stock 1 or prelaminate 20. In the manual delamination process upon activation of sensor 24 when trailing edge 25 of prelaminate 20 passes over sensor 24, it stops the rotation of prelaminate feed roller 21b to stop the feeding of prelaminate 20 toward drum 11 and closes retaining gate 19a which again prevents overdrive that could wrinkle paper stock 1 or the prelaminate 20 during the manual delamination process.

Figure 2:
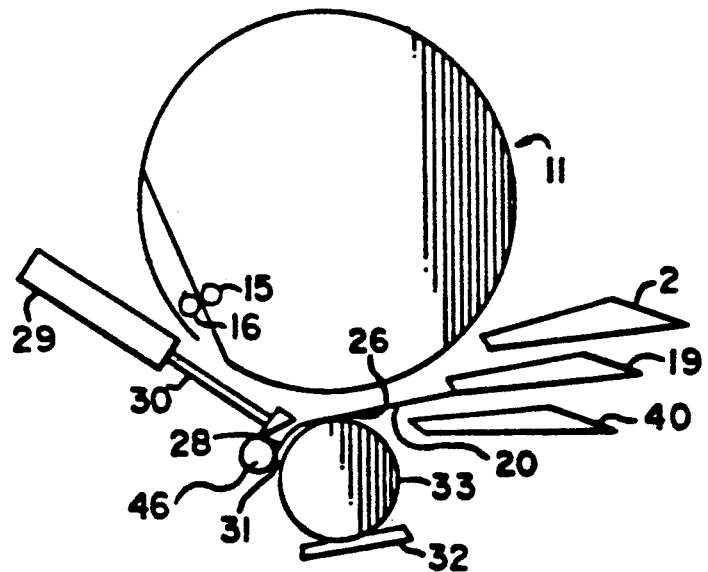
FIG. 2 is a side schematic view of the laminator in accordance with the invention with a delamination skive extended and parts removed for clarity.

In the automatic delamination process prelaminate 20 is fed toward drum 11 and into the laminator 4 until it passes through the nip 26 formed by fuser roller 33 and drum 11 as shown in FIG. 2. Fuser roller 33 may be constructed of a polypropylene to avoid sticking during the later to be discussed fusing process. As leading edge 28 of prelaminate 20 passes through nip 26, a distance in the range of one inch, monitored by sensor 23 detecting the trailing edge 25 of prelaminate 20 passing over it, sensor 23 activates a source of pressurized air, not shown, but know in the art, that activates ram 30 of skive 29, which guides leading edge 28 of prelaminate 20 into nip 31 formed by fuser roller 33 and delamination roller 46.

Once leading edge 28 of prelaminate 20 is guided into nip 31, bladder 32, as shown in FIGS. 3 and 9, is inflated to urge fuser roller 33 toward drum 11. Bladder 32, as shown in FIG. 9, is located on fuser housing 70. The inflation of bladder 32 causes fuser lift housing 78 to ride in slot 77 of fuser housing 70 until fuser roller 33, which rotates on shaft 56, of fuser lift housing 78, makes contact with prelaminate 20 contained in nip 26, paper stock 1 is secured against drum 11 and prelaminate 20 is secured against paper stock 1.

Figure 12:
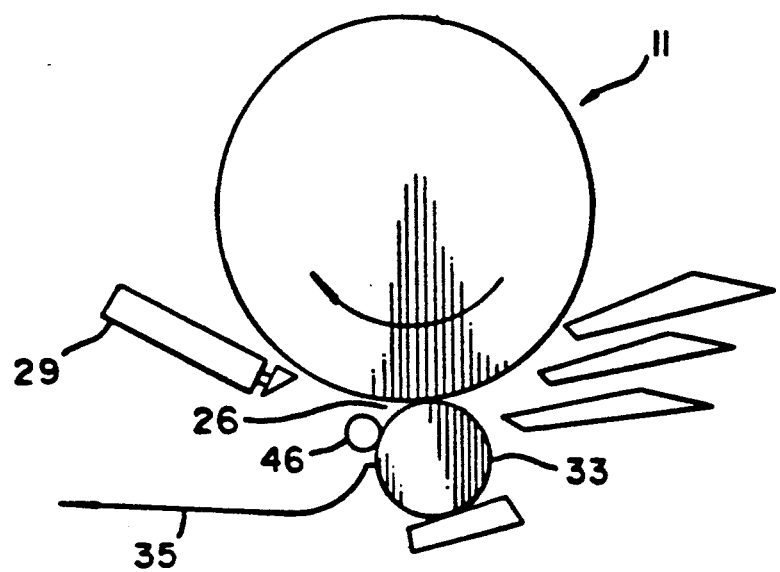
FIG. 12 is a side schematic view of the laminator in accordance with the invention showing the bladder inflated and the laminate substrate being removed.
Figure 13:
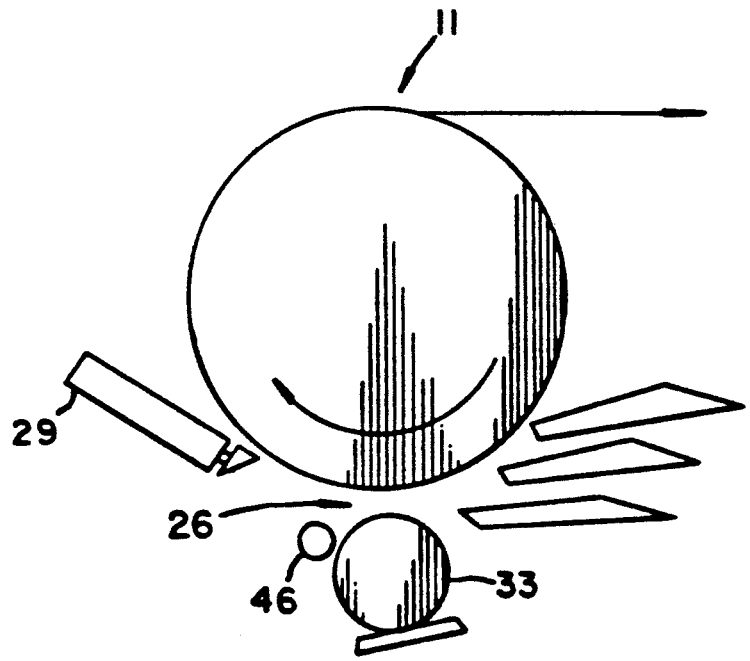
FIG. 13 is a side schematic view of the laminator in accordance with the invention with the bladder deflated and the fuser roller removed from its position adjacent the drum.

The movement of fuser roller 33 toward drum 11 also cause fuser roller 33 to form nip 31 with delamination roller 46, as shown in FIG. 12. Delamination roller 46 is pivotly attached to spring bar 66 as shown in FIG. 17 and driven by direct frictional contact with fuser roller 33 or by indirect frictional contact with fuser 33 through prelaminated 20. The amount of pressure in nip 31 being determined by the inflation of bladder 32. When bladder 32 is deflated, as shown in FIGS. 9 and 13, spring bar 66 moves to its original position against stop 65 while being secured in fuser housing 70 by retaining mounting 67. While nip 31 is formed during manual delamination, image transfer and automatic delamination, it serves no purpose during manual delamination or transfer, it does, as later discussed, have a purpose during automatic delamination.

Since bladder 32 can be inflated to any desired pressure, the pressure in nip 26, can be adjusted by varying the inflation of bladder 32 to accommodate a wide variety of commercially available prelaminates, paper stock or receiving stock. The force exerted by fuser roller 33 and drum 11 on paper stock 1 and prelaminate 20 in nip 26 is in the range of 560 lbs when paper stock of 30 pounds to 0.024 inches is used which is also the force exerted on the laminated paper stock 1a and the receiver 34, when an image 38 is to be transferred from receiver 34 to laminated paper stock 1a, the force being controlled in both operations by the amount of inflation of bladder 32.

With the positioning of the paper stock 1 and prelaminate 20 in nip 26, the lamination of paper stock 1 and delamination of prelaminate 20 begins by the rotating of drum 11, which due to frictional contact with fuser roller 33 through prelaminate 20 cause fuser roller 33 also to rotate. During the lamination and delamination process a temperature range of 100 degrees centergrade to 150 degrees centergrade for the drum and fuser is maintained. The perffered temperature, however, for paper stock in the range of 30 pound paper to 0.024 inch thick paper is 105 degrees centergrade for the drum 11 and 125 degrees centergrade for the fuser. The speed of paper stock 1 and prelaminate 20 through nip 26, for the above paper stock, is 8 to 16 inches per minute with 8 inches per minute being preferred. The pressure in nip 26 may range from 5 pounds per square inch to 12 pounds per square inch with 7.5 pounds per square inch being the preferred pressure for the above paper stock. The lamination delamination process continues until paper stock 1 is fully laminated. Once paper stock 1 is fully laminated it exits the laminator 4 through exit 44 or is recirculated, within laminator 4, for image 38 transfer to the now laminated paper stock 1a. The laminating of paper stock 1 is required to prevent any image forming dyes, that are to be transferred to paper stock 1, from receiver 34 from running, migrating or being improperly absorbed by paper stock 1. This avoids any distortion of image 38, when transferred to laminated paper stock 1a, which would produce an unusable proof image.

Lamination and delamination is caused by the heat and force applied by drum 11 and fuser roller 33 to prelaminate 20 and paper stock 1. It is also caused by the pulling force of nip 31 on the leading edge 28 of prelaminate 20 caused by prelaminate being retained in nip 26 prior to nip 31 closing on prelaminate 20 thereby causing a tugging action on prelaminate 20 which causes prelaminate 20 to separate into its two layers, the butvar layer or releasable layer 37, adjacent paper stock 1, and the estar layer or substrate layer 35, adjacent to fuser roller 33. The butvar layer 37 laminates paper stock 1 while the estar layer 35 is ripped away from the butvar layer 37 by the action of fuser roller 33 and delamination roller 46 pulling the leading edge 28 of prelaminate 20 through nip 31. This laminating of paper stock 1 and the delamination of the ester layer 35 from the butvar layer 37 continues until the trailing edge 7 of paper stock 1 is laminated. The substrate 35 after delamination from prelaminate 20 exits the laminator through slot 27 of the laminator 4.

Once the trailing edge 7 is laminated and the ester layer 35 is delaminated from the butvar layer 37, bladder 32 is deflated and fuser roller 33 moves away from drum 11. Drum 4, however, continues to rotate until paper stock 1, now laminated, either exits the laminator 4 at exit slot 44 or continues to rotate with drum 11 until slot 10 is again, as sensed by encoder 51, above contact point 58 of flexure plate 18 at which time flexure plate 18 is again activated, as previously discussed, to make contact with the now laminated paper stock 1a to keep it conformed to drum 11 to prevent wrinkles and creases of laminated paper stock 1a as the image 38 from receiver 34 is transfer to laminated paper stock 1a.

Upon encoder 51 signaling to begin to activate the image 38 transfer process to laminated paper stock 1a, drive system 64 is again activated as previously discussed, however, receiver 34 feeding is accomplished by, encoder 51 sending a signal that drum 11 is in the receiver 34, receiving position. This causes actuation of a solenoid, not shown, but known in the art, to cause pinch plate 60, of receiver feed tray cover 40c, to move rollers 47a into contact with receiver 34, loaded in receiver feed tray 40. The pinching of receiver 34 between rollers 47a and 47b causes receiver 34 to move due to the rotation of rollers 47b. Immediately upon the movement of receiver 34, caused by the pinching action of rollers 47a and 47b, retaining gate 40a is opened. This rotational feeding force of rollers 47a and 47b, coupled with the incline of receiver feed tray 40 toward laminator 4, urges receiver 34 into laminator 4 and toward drum 11.

A receiver 34 is feed into laminator 4 adjacent the laminated side of the paper stock 1. When sensor 42 senses the trailing edge 71 of receiver 34, it activates an air pressure device, not shown, but known in the art, to inflate bladder 32 as previously discussed, so that the leading edge 48 of receiver 34 is adjacent slot 10 when receiver 34 makes contact with the laminated paper stock 1a in nip 26. With the application of the heat and force created by drum 11 and fuser roller 33, receiver 34, is laminated to the laminated paper stock 1a while in nip 26. This lamination process continue with the rotation of drum 11 and fuser 33 until image 38 of receiver 34 is laminated to laminated paper stock 1a. Once the lamination of image 38 onto laminated paper stock 1a from receiver 34 is complete, laminated paper stock 1a with receiver 34 laminated to it exits the laminator 4 at exit 44. The operator picks up the laminate and removes the backing 39 of the receiver 34 leaving image 38 laminated to laminated paper stock 1a in such a manner that image 38 appears as if it had been printed on that paper stock. Image 38 at this stage is laminated between the laminate 37 of prelaminate 20 and laminate 50 of receiver 34 thereby protecting image 38 from damage while providing a proof to be reviewed for printing.

In the manual delamination process upon activation of the manual delamination button of laminator 4 nip 26 is closed by bladder 32 causing fuser 33 toward drum 11 prior to the feed of prelaminate 20. Therefore prelaminate 20 and paper stock 1 must now be fed into nip 26 as opposed to being fed through nip 26. Therefore trail edge sensor 24 must be further removed from laminator 4 than sensor 23 so that sensor 24 can sense trailing edge 25 of prelaminate sooner than sensor 23 did and thereby start the rotation of drum 11 and the lamination process sooner than sensor 23 would. Once paper stock 1 and prelaminate 20 are in nip 26 the lamination of paper stock 1 begins by the rotating of drum 11 and fuser roller 33 and continues until paper stock 1 is fully laminated and exits slot 44 of laminator 4.

In operation, in the manual delamination mode, the operator loads paper stock 1 into tray 2, the prelaminate 20, into tray 19, and the receiver 34 may or may not at this time be loaded into tray 40. The operator then press the start button for manual delamination and encoder 51 moves the drum 11 to its start position for receiving paper stock 1 for manual delamination. If sensors 5, 22, and 41 sense that paper stock 1, prelaminate 20 and receiver 34 are all in their respective feed trays or at least paper stock 1 and prelaminate 20 are loaded in their respective feed trays, laminator 4 will perform the operations of feeding paper stock 1 and prelaminate 20 and then laminating the prelaminate 20 to paper stock 1. Laminated paper stock 1a will then exit the laminator 4 at exit 44 for manual delamination of the prelaminate 20 substrate 35 from laminated paper stock 1a.

The sequence of events for manual delamination are, paper stock 1 is fed to drum 11 of laminator 4 and the leading edge 13 of paper 1 is feed through slot 10 of drum 11 into nip 14 formed by rollers 15 and 16 which at this point in time are rotating to guide and feed paper stock 1 into nip 14. Once the trailing edge 7, of paper stock 1 passes over sensor 6, sensor 6, deactivates the power to roller 15 causing rollers 15 and 16 to stop and lock paper stock 1 in nip 14. Also sensor 6, deactivates the power to feed rollers 8a, thereby preventing overdrive of paper stock 1 to nip 14 and avoiding the possibility of wrinkles and creases in paper stock 1 caused by overdriving. Encoder 51, then activates the power to drum 11 and drum 11 rotates clockwise until slot 10 is adjacent to the exit 43, of prelaminate tray 19. The moving of drum 11 to a position where slot 10 is adjacent to the exit 43, of prelaminate tray 19, is picked up by encoder 51 which then causes prelaminate feed roller 21b, to begin to rotate and feed prelaminate 20, toward drum 11. Once the trailing edge 25, of prelaminate 20, passes over sensor 24, located integral with prelaminate feed tray 19, the leading edge 28 of prelaminate 20 is in the already formed nip 26, formed by drum 11 and fuser roller 33 coming into contact by the inflation of bladder 32. With the leading edge 28 of prelaminate 20 in nip 26, fuser 33 and drum 11 begin to rotate and lamination of prelaminate 20 to paper stock 1 occurs due the the heat and pressure in nip 26. This process continues until the encoder 51 senses that the drum 11 has moved a certain distance indicating that the lamination of paper stock 1 is complete. It being remembered that all during this process the paper stock 1 is being made to conform to drum 11 by the pressure exerted by flexure plate 18 on paper stock 1 as it is fed into laminator 4. Once the lamination is complete bladder 32 is deflated and fuser roller 33 moves away from drum 11. At this point drum exit slot 45 is adjacent to laminator 4 exit slot 44 and laminated paper stock 1a is driven out of drum 11 through exit 45 of drum 11 by the reactivation of drive roller 15 causing laminated paper stock 1a to exit the laminator 4 through exit slots 44 for manual delamination by the operator.

In operation, in the automatic mode, the operator loads paper stock 1 into tray 2, the prelaminate 20, into tray 19, and the receiver stock 34, into tray 40. The operator then press the start button for automatic delamination and the encoder 51 moves the drum 11 to its start position for receiving paper stock 1 and if sensors 5, 22, and 41 sense that all three tray 2, 19 and 40, are loaded or at least tray 2 and 19 are loaded the laminator 4 will perform the operations of laminating paper stock 1, automatically delaminating the substrate 35 of the laminate 20 and if tray 40 was loaded transferring the image 38 from receiver 34 to the laminated paper stock 1a.

The sequence of events for automatic delamination and image transfer are, paper stock 1 is fed to drum 11 of laminator 4 and the leading edge 13 of paper stock 1 is feed through slot 10 of drum 11 into nip 14 formed by rollers 15 and 16 which at this point in time are rotating to guide and feed paper stock 1 into nip 14. Once the trailing edge 7, of paper stock 1 passes over sensor 6, sensor 6, deactivates the power to roller 15 causing rollers 15 and 16 to stop and lock paper stock 1 in nip 14. Also sensor 6, deactivates the power to feed rollers 8b, thereby preventing overdrive of paper stock 1 to nip 14 and avoiding the possibility of wrinkles and creases in paper stock 1 caused by overdriving. Encoder 51, then activates the power to drum 11 and drum 11 rotates clockwise until slot 10 is adjacent to the exit 43, of prelaminate tray 19. The moving of drum 11 to a position where slot 10 is adjacent to the exit 43, of prelaminate tray 19, is picked up by encoder 51 which then causes prelaminate fed roller 21b, to begin to rotate and feed prelaminate 20, toward drum 11. Once the trailing edge 25, of prelaminate 20, passes over sensor 23, located integral with prelaminate feed tray 19, a skive 29, is activated and ram 30, of skive 29, contacts the leading edge 28 of prelaminate 20, causing the leading edge 28 of prelaminate 20, to move into the nip 31, formed by delamination roller 46 and fuser roller 33. Sensor 23, upon sensing that the trailing edge 25 of prelaminate 20, has passed over it causes bladder 32 to inflate and cause fuser roller 33 to close nip 26 between it and drum 11 while also causing nip 31 between delamination roller 46 and fuser roller 33 to close and secure the leading edge 28 of prelaminate 20 within nip 31. With the closing of nip 26 and then nip 31, fuser 33 and drum 11 begins to rotate while ram 30 of skive 29 is retracted. The rotation of drum 11 and fuser roller 33 causes paper stock 1 and prelaminate 20 to be pulled through nip 26 where lamination of prelaminate 20 to paper stock 1 occurs due to the heat and pressure in nip 26. Delamination of the substrate layer 35 of prelaminate 20 also begins by prelaminate 20 separating at point 36, just subsequent to the point of lamination where release layer 37 of the prelaminate 20 holds to paper stock 1 and the substrate layer 35 of the prelaminate 20 is pulled by the pulling force of delamination roller 46 and fuser roller 33 at nip 31 on leading edge 28 of prelaminate 20. Substrate layer 35 does not stick to release layer 37 due to the heat contained in nip 26, and the force being exerted by the pulling of the lead edge 28 of prelaminate 20 through nip 31 by delamination roller 46 and fuser roller 33. This process continues until the encoder 51 senses that the drum 11 has moved a certain distance, indicating that the lamination and delamination of paper stock 1 is complete. It being remembered that all during this process the paper stock 1 is being made to conform to drum 11 by the pressure exerted by flexure plate 18 on paper stock 1 as it is fed into laminator 4. Once the lamination is complete, bladder 32 is deflated causing fuser roller 33 to move away from drum 11 and delamination roller 46. At this point drum exit slot 45 is adjacent to laminator 4 exit slot 44 and depending upon whether the laminated paper stock 1a is to leave the laminator 4, since receiver tray 40 was not loaded or receiver tray 40 was loaded and paper stock 1 is to have transferred to it image 38 contained on the receiver 34, laminated paper stock 1a either leaves the laminator 4 through exit slots 44 and 45 or continues to rotate with drum 11 until slot 10 of drum 11 is adjacent to the exit slot 46 of the receiver tray 40. If receiver tray was loaded, encoder 51 tracks laminated paper stock 1a to the point where slot 10 is adjacent to contact point 58 of flexure plate 18. At which time flexure plate 18 is activated, as previously discussed, to keep the now laminated paper stock 1a in conformity with drum 11 while receiver 34 is fed into laminator 4. The portion of laminated paper stock 1a adjacent slot 10 makes contact with receiver 34 as receiver 34 is urged by receiver rollers 47b, located to the side of receiver tray 40 to avoid any contact with the image 38 that could distort image 38 prior to its transfer to laminated paper stock 1a, and the incline of receiver tray 40, into laminator 4. Once the leading edge 48 of receiver 34, as indicated by the trailing edge 71 of receiver 34 passing over sensor 42, reaches the portion of the laminated paper stock 1a that is adjacent slot 10, drum 11 rotates and receiver 34 continues to be fed until both the paper stock 1 and the receiver are in nip 26. Once in nip 26, drum 11 discontinues its rotation and that of the fed rollers 47b. Bladder 32 is inflated and the nip 26 closes on laminated paper stock 1a and receiver 34. Drum 11 again starts to rotate and the receiver 34 with image 38 is laminated to laminated paper stock 1a due to the pressure and heat contained in nip 26. The rotation of drum 11 and the lamination continues until laminated paper stock 1a is fully laminated by receiver 34 and its image 38 transferred to laminated paper stock 1a. At that point slot 45 of drum 11 is adjacent exit slot 44 of laminator 4. Rollers 15 and 16 are then activated and paper stock 1 containing the lamination and image 38 of receiver 34 are pulled through exit channel 49 of the now stopped drum 11 and through nip 14 of rollers 15 and 16 for exit of laminator 4 through exit 44 to final product receiver tray 3. The operator then picks up the laminated paper stock 1a with receiver 34 laminated to it, peels the backing 39 of receiver 34 off of the receiver 34 and laminated paper stock 1a leaving paper stock 1a with image 38 protected between original coating 37 of papers stock 1 and the release coating 50 of receiver 34. The image 38, on paper stock 1 appears as if image 38 were printed on the paper stock 1 while being protected against damage by the coating 37 and 50.

If laminated paper stock 1a had be removed from the laminator 4 either after automatic delamination or manual delamination, it must be reinserted into laminator 4 for image 38 transfer. In operation, in this mode, the operator loads laminated paper stock 1a into tray 2 and the receiver stock 34, into tray 40. The operator then press the start button for the image transfer mode and the encoder 51 moves the drum 11 to its start position for receiving laminated paper stock 1a and if sensors 5 and 41 sense that both trays 2 and 40, are loaded laminator 4 will perform the operations of transferring the image 38 from receiver 34 to the laminated paper stock 1a.

The sequence of events for this mode are laminated paper stock 1a is fed to drum 11 of laminator 4 and the leading edge 13 of laminated paper stock 1a is feed through slot 10 of drum 11 into nip 14 formed by rollers 15 and 16 which at this point in time are rotating to guide and feed paper stock 1 into nip 14. Once the trailing edge 7a, of laminated paper stock 1a passes over sensor 6, sensor 6, deactivates the power to roller 15 causing rollers 15 and 16 to stop and lock laminated paper stock 1a in nip 14. Also sensor 6, deactivates the power to feed rollers 8b, thereby preventing overdrive of laminated paper stock 1a to nip 14 and avoiding the possibility of wrinkles and creases in laminated paper stock 1a caused by overdriving. Encoder 51, then activates the power to drum 11 and drum 11 rotates clockwise until slot 10, as tracked by encoder 51, is adjacent to contact point 58 of flexure plate 18. At which time flexure plate 18 is activated, as previously discussed, to keep the now laminated paper stock 1a in conformity with drum 11 while receiver 34 is fed into laminator 4. The portion of laminated paper stock 1a adjacent slot 10 makes contact with receiver 34 as receiver 34 is urged by receiver rollers 47b, located to the side of receiver tray 40 to avoid any contact with the image 38 that could distort image 38 prior to its transfer to laminated paper stock 1a, and the incline of receiver tray 40, into laminator 4. Once the leading edge 48 of receiver 34, as indicated by the trailing edge 71 of receiver 34 passing over sensor 42, reaches the portion of the laminated paper stock 1a that is adjacent slot 10, drum 11 rotates and receiver 34 continues to be fed until both the paper stock 1 and the receiver are in nip 26. Once in nip 26, drum 11 discontinues its rotation and that of the fed rollers 47b. Bladder 32 is inflated and the nip 26 closes on laminated paper stock 1a and receiver 34. Drum 11 again starts to rotate and the receiver 34 with image 38 is laminated to laminated paper stock 1a due to the pressure and heat contained in nip 26. The rotation of drum 11 and the lamination continues until laminated paper stock 1a is fully laminated by receiver 34 and its image 38 transferred to laminated paper stock 1a. At that point slot 45 of drum 11 is adjacent exit slot 44 of laminator 4. Rollers 15 and 16 are then activated and paper stock 1 containing the lamination and image 38 of receiver 34 are pulled through exit channel 49 of the now stopped drum 11 and through nip 14 of rollers 15 and 16 for exit of laminator 4 through exit 44 to final product receiver tray 3. The operator then picks up the laminated paper stock 1a with receiver laminated to it, peels the backing 39 of receiver 34 off of the receiver 34 and laminated paper stock 1a leaving paper stock 1a with image 38 protected between original coating 37 of papers stock 1 and the release coating 50 of receiver 34. The image 38, on paper stock 1 appears as if image 38 were printed on the paper stock 1 while being protected against damage by the coating 37 and 50.

While the present invention has been described with reference to the particular structure disclosed herein, it is not intended that it be limited to the specific details, and this application is intended to cover such modifications or changes as may come within the purposes or scope of the claims forming a part hereof.

What is claimed is:

1. In a laminating system comprising:
   a. a housing for containing the laminating system,
   b. feeding means for feeding a material to be laminated and a laminating material to the laminating system,
   c. retaining means for retaining the material to be laminated,
   d. releasing means for releasing a laminated material,
   e. transport means for transporting the material to be laminated and the laminating material,
   f. guide means for guiding the material to be laminated and the laminating material along respective paths to bring said materials together for lamination,
   g. laminating means for laminating said materials together, and
   h. conforming means for holding the material to be laminated against a backing portion of the laminating means for preventing creases and wrinkles in the material to be laminated, the conforming means including;
      a curved entrance slot means, in the backing portion of the laminating means, for guiding a leading edge of the material to be laminated to a rotary feeding means and for preventing creasing and wrinkling of the material to be laminated,
      a flexible plate, in cooperation with the rotary feeding means, for making contact and urging the material to be laminated against the backing portion of the laminating means as the material to be laminated begins its travel with the backing portion of the laminating means.

2. The laminating system according to claim 1, wherein the backing portion of the laminating means is a heated rotary drum and the conforming means includes an entrance slot means, within the heated rotary drum, for guiding a leading edge of the material to be laminated to a rotary feeding means, the rotary feeding means includes means for feeding the leading edge of the material to be laminated into the rotary feeding means and locking the leading edge of the material to be laminated in the rotary feeding means, the entrance slot means is curved where the leading edge of the material to be laminated enters the entrance slot means to prevent creasing and wrinkling of the material to be laminated, the conforming means including a flexure means, in cooperation with the rotary feeding means for making contact and urging the material to be laminated against the rotary heated drum as it passes the flexure means.

3. The laminating system according to claim 2 wherein the flexure means includes a flexure plate, a means for activating the flexure plate, a connecting means for connecting the activating means to the flexure plate and means for rotating the flexure plate into contact with the material to be laminated.

4. The laminating system according to claim 3 wherein the flexure plate is resilient and has a contact means for contacting the material to be laminated.

5. The laminating system according to claim 3 wherein the means for rotating the flexure plate into contact with the material to be laminated is a shaft secured to a side of the flexure plate.

6. The laminating system according to claim 5 wherein the means for connecting the activation means to the flexure plate is a linkage means for urging the flexure plate into contact with the material to be laminate by rotation of the flexure plate with the shaft.

7. The laminating system according to claim 6 wherein the activating means is a solenoid connected to the linkage and the material to be laminated is a 30lb to 0.024 inch thick paper.

8. A conforming means comprising a rotary drum, an entrance slot means, within the rotary drum, for guiding a leading edge of the material to a rotary feeding means, the rotary feeding means includes means for feeding the leading edge of the material into the rotary feeding means and locking the leading edge of the material in the rotary feeding means, the entrance slot means is curved where the leading edge of the material enters the entrance slot means to prevent creasing and wrinkling of the material, a flexure plate, in cooperation with the rotary feeding means, for making contact and urging the material against the rotary drum as the material to be laminated begins its travel with the rotary drum.

* * * * *